United States Patent [19]

Capasso et al.

[11] Patent Number: 4,719,496
[45] Date of Patent: Jan. 12, 1988

[54] REPEATED VELOCITY OVERSHOOT SEMICONDUCTOR DEVICE

[76] Inventors: Federico Capasso, 205 Ayliffe Ave., Westfield, N.J. 07090; James A. Cooper, Jr., 25 Upper Warren Way, Warren, N.J. 07060; Karvel K. Thornber, 23 Mercier Pl., Berkeley Heights, N.J. 07922

[21] Appl. No.: 631,041

[22] Filed: Feb. 12, 1986

Related U.S. Application Data

[63] Continuation of Ser. No. 444,237, Nov. 24, 1982, abandoned.

[51] Int. Cl.$^4$ .................... H01L 45/00; H01L 29/205
[52] U.S. Cl. .......................................... 357/4; 357/16; 357/88
[58] Field of Search ............................... 357/4, 16, 88

[56] References Cited

U.S. PATENT DOCUMENTS

| | | |
|---|---|---|
| 3,626,328 | 12/1971 | Esaki et al. .................. 357/4 |
| 3,699,401 | 10/1972 | Tietjfn et al. ................ 357/4 |
| 3,882,533 | 5/1975 | Döhler ......................... 357/88 |
| 4,103,312 | 7/1978 | Chang et al. ................. 357/4 |
| 4,194,935 | 3/1980 | Dingle et al. ................. 357/4 |
| 4,206,002 | 6/1980 | Sabnis et al. ................ 357/88 |
| 4,353,081 | 10/1982 | Allyn et al. ................... 357/4 |
| 4,590,507 | 5/1986 | Capasso et al. .............. 357/88 |

OTHER PUBLICATIONS

R. Dingle et al, "Electron Mobilities in Modulation-Doped Semiconductor Heterojunction Superlattices," *Applied Physics Letters,* vol. 33, No. 7, Oct. 1, 1978, pp. 665-667.

T. J. Maloney et al, "Transient and Steady-State Electron Transport Properties of GaAs and InP," *Journal of Applied Physics,* vol. 48, No. 2, Feb. 1977, pp. 781-787.

L. F. Eastman, "The Limits of Electron Ballistic Motion in Compound Semiconductor Transistors," *The International Symposium on Gallium Arsenide and Related Compounds,* Japan, 1981, pp. 245-250.

*Primary Examiner*—Gene M. Munson

[57] ABSTRACT

Semiconductor structures suitable for repeated velocity overshoot are described. The structure comprises at least two velocity overshoot sections with each section comprising a first semiconductor region having a rapid change in potential and a dimension such that the carrier transit time is comparable to or shorter than the mean scattering time and a second semiconductor region having a more gradual change in potential and a dimension such that the carrier transit time is sufficient to allow the energy relaxation time to be exceeded.

20 Claims, 9 Drawing Figures

REPEATED VELOCITY OVERSHOOT SEMICONDUCTOR DEVICE

This application is a continuation of application Ser. No. 444,237, filed Nov. 24, 1982, now abandoned.

TECHNICAL FIELD

This invention is concerned generally with semiconductor devices and particularly with such devices having repeated velocity overshoot.

BACKGROUND OF THE INVENTION

Much effort in modern semiconductor technology has been devoted to making devices that are capable of operating at high speeds. Such devices may be photodetectors, lasers, field effect transistors, etc. Some of this effort has been directed toward developing materials that should permit devices to operate at higher speeds by increasing the carrier velocity. For example, some Group III-V semiconductor compounds, such as gallium arsenide and indium gallium arsenide, have higher electron mobilities than does silicon. This should yield higher speed device operation at lower voltages because the electron drift velocity is a linear function of the electric field at low electric field values. Thus, the higher mobility leads to higher electron velocities at lower fields. Additionally, some Group III-V compounds have a longer mean free path for electrons than does silicon. As a result, under transient conditions electron velocities well in excess of the steady state velocity are obtained for short electrical lengths.

Some effort has also been directed toward developing new structures that are capable of high speed operation and have high carrier mobility. For example, modulation doped structures with high carrier mobility have been developed by Dingle et al and are described in *Applied Physics Letters*, 33, pp. 665–667, Oct. 1, 1978.

For purposes of discussion, the electron transport may be conveniently viewed as being of one of three types. The first type is collision dominated, and characterizes relatively long electrical lengths. This is a steady state behavior in which most, if not all, present day commercial semiconductor devices operate. The second type of transport is the ballistic type that characterizes very short electrical lengths. In this type, electrons are accelerated to the crystal limited velocity in a distance that is less than the mean free path for scattering and the electron velocity is derived from the potential drop. The third or intermediate type of transport is commonly termed "velocity overshoot". This is a transient type of transport in which the electron velocity exceeds the final velocity for a brief time period. Electron transport of these types are discussed in detail in *Journal of Applied Physics*, 48, pp. 781–787, February 1977. The study reported here assumed a uniform electric field and used the results of a Monte Carlo simulation of the electron transport properties to characterize velocity overshoot.

The physical mechanisms responsible for velocity overshoot may be briefly described. First, the rate of scattering of an electron is dependent on its energy in such a manner that once a threshold energy is exceeded, the scattering rate is enhanced considerably. In silicon or germanium, this enhancement is due to the onset of phonon emission which is an inelastic process. In compound semiconductors such as GaAs and InP this enhancement is due to the onset of quasi-elastic scattering to and from valleys of higher effective mass. Such scattering processes lead to lower average drift velocities than would have resulted in their absence. Such lower velocities are apparent in static steady state, i.e., velocity versus field curves, where velocity, having first increased linearly with electric field, saturates or even decreases at higher fields.

The second physical mechanism necessary for velocity overshoot is the time delay inherent in scattering processes, that is, their statistical nature and especially their Poisson character. Thus, it is possible to temporarily achieve high average drift velocities by abruptly increasing the electric field before the higher scattering rates have time to become fully effective in decelerating the electrons. Eventually, however, the higher scattering rates manifest themselves, first relaxing the excess momentum and then the excess energy.

One further aspect should be considered. If instead of applying the higher field indefinitely, the field is decreased back to its original value before the energy of most electrons exceeds the threshold for enhanced scattering, then the relaxation of this higher velocity will be advantageously delayed, being characterized by the lower relaxation rates associated with the lower field. In this manner the average velocity is enhanced over what it would have been had the field remained constant. The crucial physical parameter is the threshold energy for enhanced scattering, and the degree to which the electron's energy can be increased advantageously is limited by this threshold.

Although this nonsteady state electron transport, i.e., velocity overshoot, has been studied theoretically for a substantial period of time, for most of this time it was a theoretical curiosity because of the impracticality of realizing useful device structures due to the lack of suitable crystal growth techniques.

However, with the recent development of molecular beam epitaxy and the possibilities this growth technique offers for fabricating new structures, it has become possible to consider practical device structures that might utilize the nonsteady state electron transport. For example, L. F. Eastman discusses the use of planar doped barriers, i.e., layers that are highly doped, to rapidly accelerate electrons in a paper presented at *The International Symposium on Gallium Arsenide and Related Compounds*, Japan, 1981, pp. 245–250. However, these devices had only a single velocity overshoot with the second planar doped barrier layer being used to decelerate the electrons. As a result, the devices are useful only for very small, i.e., submicron, features.

SUMMARY OF THE INVENTION

We have found that it is possible to have semiconductor devices with at least two repeated velocity overshoot sections thereby permitting velocity overshoot over extended distances. The velocity overshoot section comprises a first semiconductor region having a rapid change in potential and a dimension such that the carrier transit time is comparable to or shorter than the mean scattering time, and a second semiconductor region having a more gradual change in potential and a dimension such that the carrier transit time is sufficient to allow the energy relaxation time to be exceeded. The regions having a rapid change in potential move the electron distribution up to a higher energy, without any substantial broadening of the distribution, in a time that is short with respect to the mean scattering time. This region may be obtained by a rapid change in the energy bandgap that is produced by a graded composition or by periodic doping profiles such as pairs of planar doped barrier layers. The region having a gradual change in potential may comprise a semiconductor having a graded or variable bandgap. By using repeated contiguous structures of this type, it is possible to obtain average drift velocities in excess of the maximum steady state velocity over distances up to at least tens of microns. In one embodiment, the structure further comprises p- and n-type semiconductor regions contacting the repeated velocity overshoot structure, and the entire device is a photodetector. In another embodiment, the device further comprises two semiconductor regions having the same conductivity type contacting the repeated overshoot region and means for modulating the current through said repeated velocity overshoot structure.

DETAILED DESCRIPTION

Figure 1:
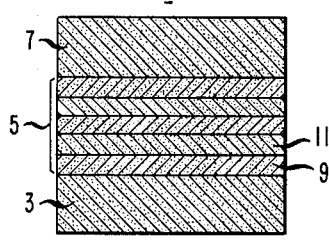
FIG. 1 is a cross-sectional view of one embodiment of our invention.

For reasons of clarity, the elements of devices according to our invention will not be shown to scale. One embodiment of our invention is depicted in a sectional view in FIG. 1. The device, indicated generally as 1, comprises region 3, repeated overshoot structure 5, and region 7. The repeated overshoot structure comprises at least two velocity overshoot sections. Each section comprises a region 9 and region 11. Region 9 has a small electric field, i.e., a gradual change in potential, and a dimension such that the carrier transit time is sufficient to allow energy relaxation to occur before another overshoot. Region 9 may comprise a semiconductor having a graded bandgap. The bandgap need not be graded linearly and may be constant for some portions of the region. Region 11 has a rapid change in potential, that is, a large electric field, and a dimension such that the carrier transit time is shorter than or comparable to the mean scattering time. The change in potential should be such that the energy of most electrons does not exceed the threshold for enhanced scattering. The high electric field regions 11 may comprise graded energy bandgaps, i.e., regions having a rapid change in the energy bandgap produced by a graded composition or alternating p- and n-type planar doped barrier sheets.

The device is useful as a photodiode when regions 3 and 7 comprise semiconductor materials having first and second conductivity types, respectively. Alternatively, either or both regions 3 and 7 may comprise a metal layer forming a Schottky barrier, and the device is also a photodiode.

Figure 2:
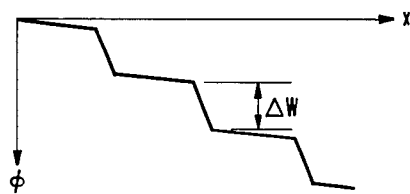
FIG. 2 shows the staircase potential configuration for one embodiment of our invention.
Figure 3:
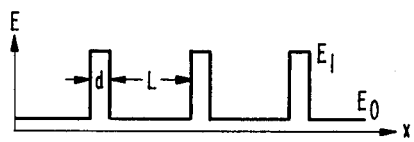
FIG. 3 shows the electric field corresponding to the potential depicted in FIG. 2.

The operation of the repeated overshoot structure is better understood by reference to FIG. 2 which shows a suitable electric potential for a device of our invention. The distance is plotted horizontally and the potential vertically. The potential has a shape that is analogous to that of a stair and may be referred to as a staircase potential with the changes in potential being equal to $\Delta W$ as shown. The corresponding electric field, i.e., the field produced by this potential, is shown in FIG. 3 with the distance being plotted horizontally and the electric field vertically. The electric field comprises a plurality of high electric field regions having a value $E_1$ and a width d, hereafter referred to as the accelerating regions, superimposed upon the background electric field $E_0$ comprising the overshoot regions. The high field regions are separated by a distance L.

Figure 4:
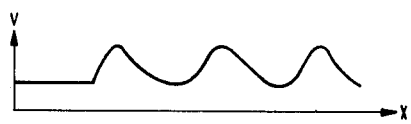
FIG. 4 plots the ensemble velocity as a function of position for the potential in electric fields of FIGS. 2 and 3.

We believe that the electrical behavior and design considerations, i.e., the magnitude of $E_1$ and the distances d and L, may be better understood if we first consider a specific embodiment, namely, the electrons in the central valley of GaAs. It should be noted that our device has a stepped electric field in which carriers remain in the central valley, and overshoot occurs during the momentum relaxation time. The background electric field, $E_0$, is chosen so that the steady state electron energy distribution is not excessively broadened beyond its thermal equilibrium value, but simultaneously, the average drift velocity is still relatively high. For GaAs, an appropriate background field is approximately 2.5 KV/cm. For this field, the steady state drift velocity is approximately $1.8 \times 10^7$ cm/sec and fewer than 2 percent of the electrons are in the satellite valley. The electron distribution immediately downstream from the high field region is shifted upward in energy by an amount $\Delta W = E_1 d$. It should be noted that while the distribution is shifted uniformly in energy, it is advantageously compressed in momentum in the direction of transport. The magnitude of d is chosen so that the electron transit time across the high field region is less than the mean phonon scattering time. This scattering time is approximately 0.13 psec in GaAs. The energy step $\Delta W$ should be chosen to maximize the average velocity of the distribution after the step and keep most of the distribution below the threshold energy for transfer to the satellite valley. In GaAs, the intervalley separation is approximately 0.3 eV so that an appropriate value of $\Delta W$ is about 0.2 ev. This results in an average velocity of approximately $10^8$ cm/sec immediately after the potential step. The momentum decays rapidly after the step primarily through scattering by polar optical phonons. Consequently, the velocity decreases approximately linearly with distance as shown in FIG. 4 which plots the distance horizontally and the velocity vertically. During this time, the distribution broadens considerably in momentum. After the momentum and velocity have relaxed, the distribution requires additional time to relax to its original energy. Thus, the spacing L between the high field regions must be great enough to allow sufficient cooling of the electron distribution before another velocity overshoot is attempted. This spacing is necessary to avoid populating the high mass satellite valleys during the next encounter with an accelerating, i.e., high field, region.

Numerical values for the length L and the time average velocity v may be obtained as follows. Although the concepts of momentum and energy relaxation times lose their validity for energies near the optical phonon energy of 0.035 eV, effective momentum relaxation times may be thought of. The momentum relaxation time in this energy range is about 0.25 psec. If it is assumed that two relaxation times are required for complete momentum relaxation, the average distance traveled during momentum relaxation is about 3,000 Angstroms. The energy relaxation process requires approximately 8 polar optical phonon scattering events. The mean time between scattering events is 0.13 psec and approximately 1 psec as required for complete energy relaxation. If it is realized that this process occurs simultaneously with momentum relaxation, the additional distance that is required for adequate energy relaxation is approximately 1,000 Angstroms. Thus, the spacing L should be approximately 4,000 Angstroms, and the time average drift velocity v is approximately $4 \times 10^7$ cm/sec. This value is well in excess of the maximum steady state electron velocity.

It should be noted that in this model, the average velocity does not depend directly on either of the energy or momentum relaxation times but on the ratio of these times. It should also be noted that the above model neglects effects due to the alteration of the electron distribution in regions near the potential steps. To the left of the step, the distribution contains few electrons that are moving to the left and the average velocity increases as the step is approached. To the right of the step, the distribution contains some electrons that are back-scattered, that is, they are moving from the right, so that the average velocity is somewhat less than $10^8$ cm/sec. The two effects tend to cancel out each other and the average drift velocity is close to that calculated using a simple model.

Figure 5:
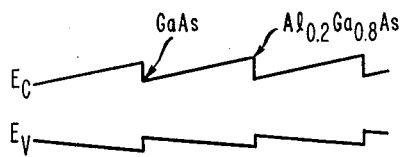
FIG. 5 is the energy band diagram of a graded bandgap embodiment of our invention.
Figure 6:
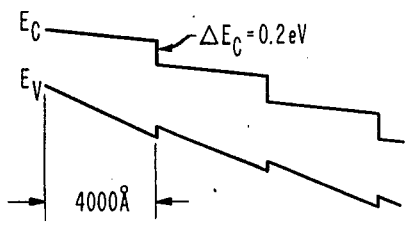
FIG. 6 is the energy band diagram of the embodiment of FIG. 5 under bias.

The staircase potential may be achieved by several types of structures. For example, it may be achieved by structures using a graded bandgap. For example, the composition may be graded from GaAs to $Al_{0.2}Ga_{0.8}As$ followed by a stepback to GaAs. The band structure of this device is depicted in FIG. 5 for an unbiased device. The band structure for this device under bias is depicted in FIG. 6. The rapid change in potential is substantially produced by a rapid change in the conduction band edge. In FIGS. 5 and 6, the conduction and valence bands are indicated as $E_c$ and $E_v$, respectively. The discontinuity in the conduction band is approximately 0.2 eV. Of course, other compositions of Group III-V compound semiconductors, such as $(Al_xIn_{1-x})_yGa_{1-y}As$, may be used as well, as well as Group II-VI compound semiconductors.

There are several problems that may arise with a graded bandgap repeated overshoot device. These problems include losses due to enhanced alloy scattering in the ternary material and reduced valley separation at the higher Al concentration. These effects may be alleviated by using a region of ungraded GaAs immediately after each potential step.

Figure 7:
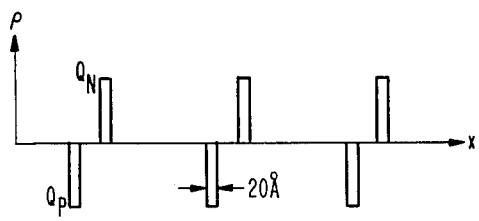
FIG. 7 depicts the charge for the planar doped barrier layer embodiment of our invention.
Figure 8:
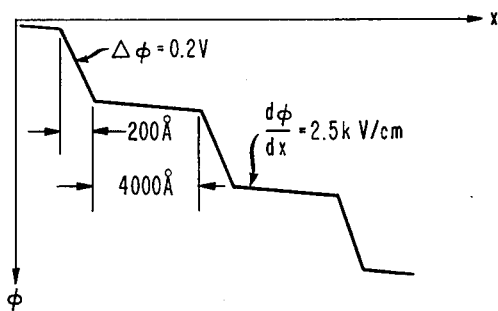
FIG. 8 shows potential for the embodiment of FIG. 7 under bias.

A second class of structures uses periodic doping profiles such as alternating n-type and p-type planar doped charge sheets. The charge density as a function of distance is depicted in FIG. 7 which plots distance horizontally and the charge density vertically. This depicts a planar doped velocity overshoot device having alternating charge sheets placed in the drift region of a p-i-n diode. For GaAs, the spacing d between the p- and n-doped sheets should be about 200 Angstroms with the sheet thicknesses on the order of 20 Angstroms. The doping density should be about $6 \times 10^{11}$ cm$^{-2}$. FIG. 8 plots the distance horizontally versus the potential vertically for the planar doped barrier layer embodiment. An advantage of the planar doped repeated overshoot device structure as compared to the staircase is that it is applicable to elemental semiconductors such as the Group IV elements silicon and germanium. Other useful compositions include Group III-V compound semiconductors such as $(Al_xIn_{1-x})_yGa_{1-y}As$ grown lattice matched to, for example, InP substrates and Group II-VI compound semiconductors.

Several practical concerns arise with respect to this device. For example, there is momentum loss due to Coulomb scattering at the charge sheets and quantum mechanical reflections from potential steps might be considered. However, a simple worse case calculation shows that these effects will not seriously reduce the expected velocity. It should also be noted that one should take care that space charge effects due to injected carriers do not appreciably distort the field profile.

Figure 9:
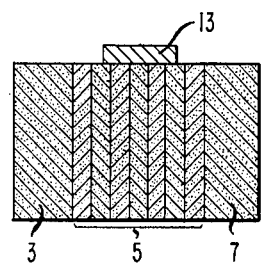
FIG. 9 is a sectional view of another embodiment of our invention.

The repeated overshoot structure may also be used in a field effect transistor. One device is schematically depicted in FIG. 9. In this device, regions 3 and 7 have a first conductivity type, and region 5 further has means 13 for modulating the current flow through the repeated overshoot structure. Regions 3 and 7 are source and drain regions. Means 13, which serves as a gate, may be a gate structure such as a metal layer resulting in a structure analogous to a MESFET or an insulated gate resulting in a structure similar to an IGFET. It will be apparent to those skilled in the art that for an enhancement mode IGFET the gate structure should have an extent such that it is up against the source and drain regions. Additionally, means 13 may be a conducting grid comprising, for example, a metal, embedded in structure 5 resulting in a device analogous to a permeable base transistor.

Devices according to our invention may be fabricated by techniques such as molecular beam epitaxy, that are well known to those skilled in the art and permit precise control of either or both composition and doping. It will also be readily appreciated by those skilled in the art that the devices may be fabricated in both mesa and planar embodiments.

What is claimed is:

1. A semiconductor device comprising a repeated overshoot structure, said structure comprising at least two sections, each section comprising a first semiconductor region having a rapid change in potential, said change being produced by alternate n-type and p-type periodic doping profiles comprising alternating planar doped barrier layers or a staircase potential and a dimension such that the carrier transit time is shorter than or comparable to the electron scattering time and a second semiconductor region having a more gradual change in potential and a dimension such that the carrier transit time is sufficient to allow energy relaxation to occur.

2. A semiconductor device as recited in claim 1 in which said regions comprise a Group III-V compound semiconductor.

3. A semiconductor device as recited in claim 1 in which said regions comprise a Group IV element semiconductor.

4. A semiconductor device as recited in claim 1 in which said regions comprise a Group II–VI compound semiconductor.

5. A semiconductor device as recited in claim 1 in which said second region comprises a semiconductor having a variable bandgap.

6. A device as recited in claim 1 further comprising first and second regions on opposite sides of said repeated overshoot structure.

7. A semiconductor device as recited in claim 5 in which at least one of said first and second regions comprises a metal.

8. A device as recited in claim 6 in which said first and second regions comprise semiconductors.

9. A device as recited in claim 8 in which said first and second regions have opposite conductivity types.

10. A device as recited in claim 8 in which said first and second regions have the same conductivity type.

11. A device as recited in claim 10 further comprising means for modulating the current through said repeated overshoot structure.

12. A device as recited in claim 11 in which said means comprises a gate structure.

13. A device as recited in claim 11 in which said means comprises a conducting grid embedded in said repeated overshoot structure.

14. A semiconductor device comprising at least two sections, each section being a velocity overshoot section and comprising a first semiconductor region having a change in potential over a dimension shorter than the electron mean free path and a second semiconductor region having a change in potential over a dimension longer than with respect to the electron mean free path.

15. A semiconductor device as recited in claim 14 in which said first region has a staircase potential.

16. A semiconductor device as recited in claim 14 in which said first region comprises alternating n-type and p-type planar doped barrier layers.

17. A device as recited in claim 14 further comprising first and second regions on opposite sides of said repeated overshoot structure.

18. A device as recited in claim 17 in which said first and second regions have opposite conductivity types.

19. A device as recited in claim 17 in which said first and second regions have the same conductivity type.

20. A device as recited in claim 19 further comprising means for modulating the current through said repeated overshoot structure.

* * * * *